United States Patent [19]

Fleischer

[11] 4,117,355
[45] Sep. 26, 1978

[54] TEMPERATURE INDEPENDENT TRIGGER PULSE ANALYSIS CIRCUIT

[75] Inventor: Helmut Fleischer, Schwieberdingen, Germany

[73] Assignee: Robert Bosch GmbH, Stuttgart, Germany

[21] Appl. No.: 776,742

[22] Filed: Mar. 11, 1977

[30] Foreign Application Priority Data

Mar. 15, 1976 [DE] Fed. Rep. of Germany ....... 2610841

[51] Int. Cl.² ............................................. H03K 17/14
[52] U.S. Cl. ....................................... 307/310; 328/3; 307/246; 307/273
[58] Field of Search ............................ 328/20, 207, 3; 307/310, 246, 273

[56] References Cited

U.S. PATENT DOCUMENTS

| | | | |
|---|---|---|---|
| 3,571,732 | 3/1971 | Richardson | 328/20 X |
| 3,573,495 | 4/1971 | Xylander | 307/310 X |
| 3,764,927 | 10/1973 | Allinger | 328/20 X |

Primary Examiner—John S. Heyman
Attorney, Agent, or Firm—Flynn & Frishauf

[57] ABSTRACT

To obtain input signals as a function of various types of input signals, R/C circuits are used to charge or discharge a capacitor, the charge state of which is sensed by a threshold stage. To render such circuits essentially independent of temperature changes, in spite of different response levels of the R/C circuit and the threshold stage, a second R/C circuit and threshold stage are connected in parallel with the first, one threshold stage being responsive to charging direction of the capacitor, the other threshold stage being responsive to discharging direction of the capacitor, and the overall output signal being a combination of the output signal from both threshold stages so that increase of the signal components of the combined output signal from one threshold stage, due to temperature increase, for example, will be balanced by a decrease of the signal component from the other threshold stage, thereby rendering the overall output essentially temperature independent.

13 Claims, 4 Drawing Figures

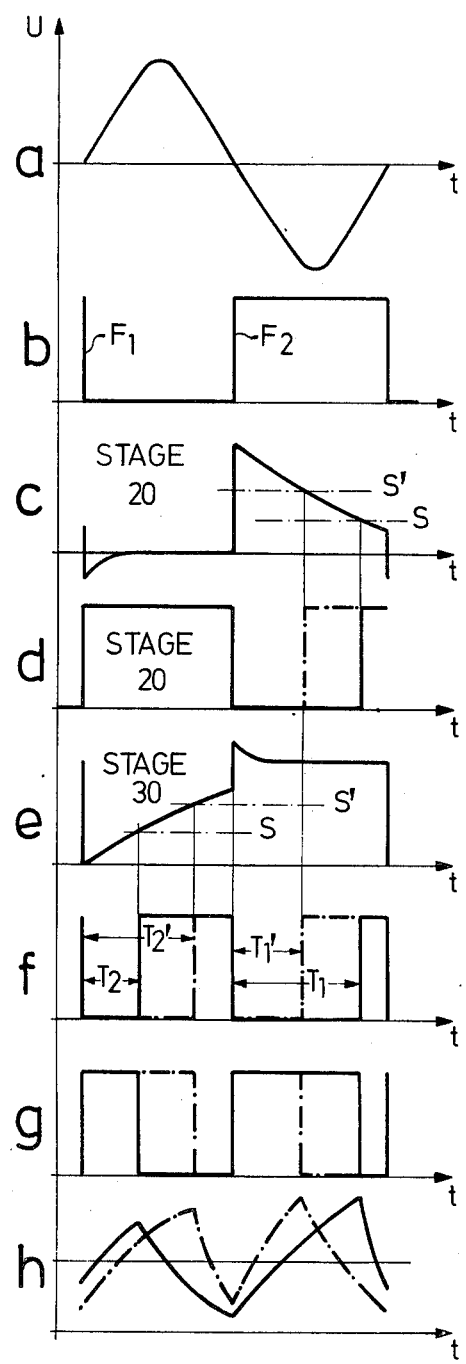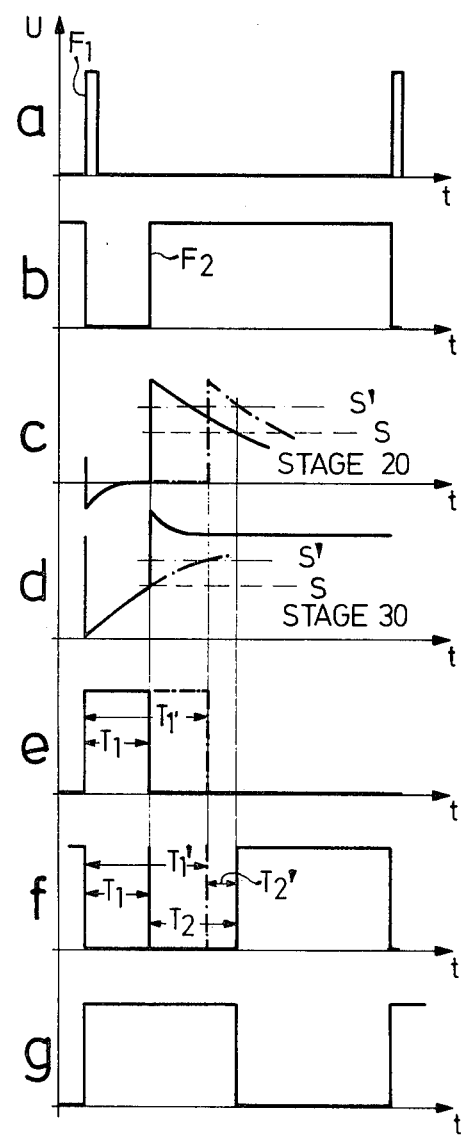

TEMPERATURE INDEPENDENT TRIGGER PULSE ANALYSIS CIRCUIT

The present invention relates to a temperature independent trigger pulse analysis circuit, and more particularly to such circuits in which pulses of predetermined durations are derived from a trigger signal so that output signals of constant pulse width can be derived from randomly or varying input signals.

Various types of such circuits have been proposed. Usually, they include a timing circuit formed of a an R/C combination, in which a flank, for example the positive flank of the trigger signal causes the timing circuit to be charged to a predetermined value, discharge of the timing circuit at a controlled rate then setting a threshold circuit when a certain threshold is passed. The capacitor of this R/C timing combination is discharged over a discharge resistor. When the threshold level of the threshold circuit connected to the R/C combination is reached, the threshold circuit provides a pulse defining, for example, the termination of the output pulse which was started with the flank of the trigger signal. The output of the threshold switch thus will have a pulse appear thereat which depends on the timing constant of the timing circuit and on the level of the threshold setting, that is, on the threshold level of the threshold circuit.

Trigger circuits and pulse analysis circuits of this type have the disadvantage that change in temperature causes change of the threshold level of the threshold circuit. This is particularly true in inexpensively constructed threshold circuits. As a result, the output pulse time will change with temperature. This change in temperature may exceed tolerance levels, especially when circuits of this type are used in automotive applications where they are subject to widely varying ambient temperature conditions. The output pulses are frequently used in combination with an integrator to provide an output voltage representative of pulse repetition rate, or frequency of input pulses. If the output pulse width changes, the voltage at the frequency-voltage converter will likewise change with temperature so that frequency-voltage converters using such circuits cannot be used in many applications where wide temperature swings are to be expected.

It is an object of the present invention to provide a pulse analysis circuit, and particularly a circuit in which output signals of essentially constant pulse width or output level can be derived from input trigger pulses, while being essentially independent of temperature variations, with a minimum of complexity and using only circuit components which are easily and inexpensively available.

Subject matter of the present invention: The threshold circuit — trigger circuit combination used, in accordance with the prior art, has a second additional trigger circuit connected in parallel thereto, combined with a second threshold circuit. The second trigger circuit is set by a flank of the trigger signal other than the flank which sets the first trigger circuit, and derived from the trigger pulse. A logic combining output circuit then combines the output signals from both the threshold circuits; the combination can be so effected that temperature variations compensate each other.

In accordance with a feature of the invention, the threshold level is shifted in the second circuit, the second circuit being so arranged that temperature variations tend to shorten the pulse from the second circuit when they tend to lengthen the pulse from the first, the combining logic circuit combining both pulses so that changes due to the temperature are self-compensating in the combined output. Thus, after the two pulses are combined, the output will have a signal available thereat which has a pulse width that is practically independent of temperature.

The second flank of the trigger signal may be trailing flank of the trigger signal; this is a particularly desirable embodiment if the trigger signal is symmetrical and the pulse time is greater than the duration of the unstable phase of the trigger stage triggered by the signal. Each trigger pulse then will provide two temporally relatively shifted pulses. Under ideal conditions, the pulse time of both the pulses will be the same. A shift of the threshold level of the threshold switch changes the pulse period of one of the threshold circuits to be less, but the other to be greater, so that the combined pulse period of both pulses will be approximately unvarying. Such circuit arrangements are particularly useful when combined with output integrating circuits providing a direct output voltage representative of input trigger signal frequency or repetition rate. The output pulse signal will be frequency doubled and, due to the frequency doubling, an integrated output voltage level will have lesser waviness, or superimposed undulation, which is highly desirable for further processing of such a signal.

Very narrow pulses can also be processed by the circuit; for example, pulses which have a pulse duration which is shorter than the duration of the unstable phase of the trigger stage can be processed by utilizing the trailing flank of the output signal of one of the threshold stages as the setting flank for the other trigger stage. Again, two pulses are generated, one immediately following the other. Thus, there is no frequency doubling. This circuit has the advantage that it can process pulses of any kind — wider or narrower than the pulse duration of the unstable phase of the trigger stage. It is particularly suitable for such applications in which the on/off ratio, or the duty cycle of the input signal varies.

The circuit becomes essentially temperature independent and thus threshold switches can be used constructed simply as threshold-sensitive gates, for example MOS gates of the same type, usually in a single housing and, for example, integrated circuits. The temperature dependent change of threshold levels then will be self-compensating and will be the same for all gates.

Drawings, illustrating an example:

FIG. 2 shows in a series of graphs $a$–$h$ voltage-time diagrams of signals arising at various points of the circuit;

Figure 3:
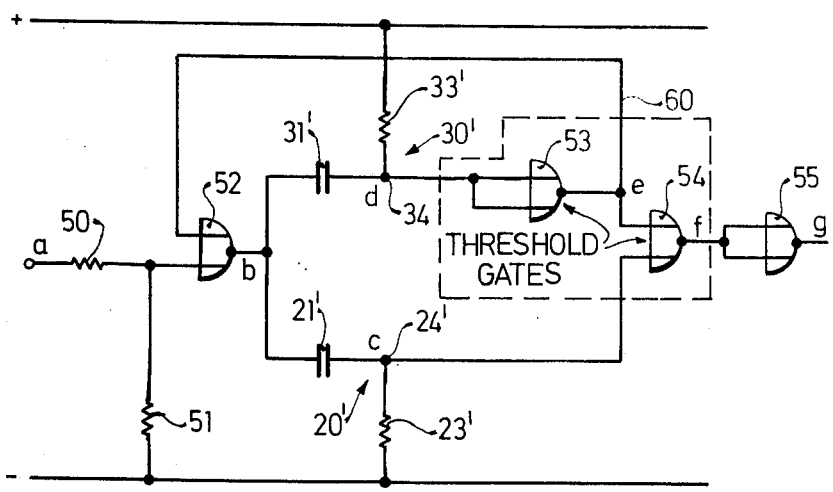
FIG. 3 is a schematic circuit diagram of another embodiment.

and FIG. 4 shows signal-time diagrams of signals arising in the embodiment of FIG. 3.

Figure 1:
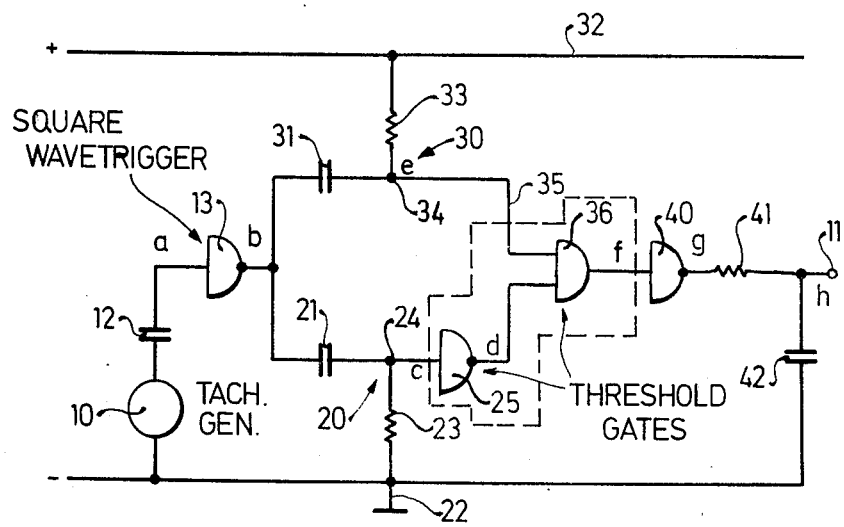
FIG. 1 is a schematic circuit diagram of a first embodiment of the circuit in accordance with the invention.

FIG. 1 illustrates a frequency-voltage converter to provide a d-c output voltage measurable at terminal 11 and representative of the frequency of the output from a tachometer generator 10. The tachometer generator 10 provides a sine wave a-c voltage which is coupled through capacitor 12 to a Schmitt trigger 13. The output from Schmitt trigger 13 provides a square wave which is approximately symmetrical.

The letters in FIGS. 1 and 3 indicate the lines of the graphs of FIGS. 2 and 4 respectively in which the signals are illustrated.

The output of square wave trigger 13 is connected to two parallel connected trigger stages 20, 30. Trigger stage 20 includes a series connected capacitor 21 and resistor 23. Resistor 23 is connected to a ground line connection 22. The positive supply is shown as bus 32, preferably a stabilized voltage. The common junction 24 between capacitor 21 and resistor 23 of the R/C network is connected to inverter 25. Inverter 25 operates as a threshold gate.

In accordance with the present invention, a second trigger stage 30 is connected in parallel to the first trigger stage 20. Trigger stage 30 likewise is constructed as an R/C circuit having a capacitor 31 and a resistor 33 connected at a common junction 34. The common junction 34 is connected through line 35 to an AND-gate 36, likewise operating as a theshold gate. The second input of the AND-gate is derived from the output of the threshold gate — inverter 25. Gate 36, therefore, has the dual function of a threshold gate and a logic circuit. An inverter 40 is serially connected to the output from gate 36. To derive a d-c voltage output signal, an averaging or integrating circuit is connected to the output from inverter 40, formed of the resistor-capacitor network 41, 42, to provide an output signal with respect to ground bus 22 at terminal 11.

In actual practice, AND-gate 36 and inverter 40 can be combined in a single NAND-gate, so that all gates can be made in similar construction. Circuit elements including three combined NAND-gates are commercially available and are inexpensive.

Operation, with reference to FIG. 2:

The signals arising in the circuit of FIGS. 1 and 3 are indicated by lower-case letters, which correspond to the lettering of the graphs.

As soon as the voltage from tachometer generator generator 10 becomes slightly positive, that is, upon rise of the voltage wave, graph $a$ of FIG. 2, the voltage at the output of the gate 13 forming the trigger jumps to approximately ground, or chassis, or reference level voltage. The negative switching flank $F_1$ of graph $b$ causes setting, or energization of the timing circuit of the second bistable trigger stage 30, see graph $e$. The voltage at the common junction point 34 will jump to a value which is below the threshold value S of the threshold stage formed by the AND-gate 36, as soon as the switching flank $F_1$ of the trigger signal has occurred. Capacitor 31 will charge through resistor 33, the charge curve being shown in graph $e$.

The positive flank $F_2$ of the trigger signal sets the trigger stage 20. The voltage at junction 24 rises to approximately supply voltage and capacitor 21 can discharge through resistor 23. The voltage, as seen in graph $c$, will rise to a level above the threshold level S of the inverter 25, functioning as a threshold stage. Graph $d$ shows the output of the inverter 25. Initially, the output of inverter 25 will have a positive voltage while, during the duration of the unstable phase of the trigger stage 20, it will be close to reference potential, as seen in graph $d$. The combined output appearing at the AND-gate 36, functioning in combination as an AND-gate and threshold stage, is seen in graph $f$. This output signal is available only if both inputs have a signal appear thereon. The signals of graphs $d$ and $e$ are thus combined by the AND-gate 36. The inverted signal is seen in graph $g$, which is averaged into an output signal seen in graph $h$.

The output signal has an average value on which undulation are superimposed. The undulations are of double frequency which decreases the amplitude of the undulations.

The change in threshold level due to increase in temperature is shown at levels S', and the resulting waves in chain-dotted form. Comparing the diagrams graphs $c$ and $d$ of the full-line and broken-line shapes, it is seen that the pulse time of the pulse from stage 20 is decreased from time $T_1$ to $T_1'$. Comparing the diagrams 2$e$ and 2$f$ shows that the pulse time of the signal derived from the trigger stage 30 is increased from time $T_2$ to $T_2'$. The addition of the time, namely $T_1 + T_2$ and $T_1' + T_2'$ results, however, in an approximately constant value. As a result, the average value available at output 11 will be an average d-c value which is constant in spite of temperature changes and resulting shift in threshold level of the threshold circuits. The output from terminal $h$ will thus be dependent only on the input of the input signal.

The embodiment of FIG. 3 is primarily intended for use with signals in which the ON/OFF ratio, or the duty cycle (ON/ON+OFF ratio) is variable. The pulse time of the trigger pulses shown in FIG. 4, graph $a$, may be less than the duration of the unstable phase of the trigger stage.

The trigger signal as seen in graph $a$, FIG. 4, is applied to a coupling voltage divider formed of resistors 50, 51 and to an input NOR-gate 52. NOR-gate 52 has the parallel circuit of two trigger stages 20', 30' connected thereto. Stage 20' is formed of the R/C network 23', 21' with common junction 24'; the trigger circuit 30' is formed of the R/C network 33', 31' with common junction 34'. The threshold stage of trigger circuit 30' is formed by the NOR-gate 53, operating as an inverter. The signals of the two trigger stages 20', 30' are logically combined in NOR-gate 54, forming simultaneously the threshold stage for the trigger stage 20'. Thus, gates 53, 54 function as threshold gates, gate 54 additionally functioning as a logic gate. The output signal of NOR-gate 54 is inverted by a further NOR-gate 55 connected as an inverter.

The circuit so far described functions similarly to the circuit of FIG. 1. It is composed of four NOR-gates, preferably MOS-type structures which can be combined on a single integrated circuit which is an inexpensive article of commerce. The threshold gates are shown as one unit by dotted lines in FIGS. 1 and 3.

The basic difference between the circuit of FIGS. 1 and 3 is a feedback line connecting the output of gate 53 through feedback line 60 to the input of NOR-gate 52. This feedback line — as will be described below — thus provides for setting of one of the timing circuits, not necessarily from a flank of the input signal but rather possibly from the trailing flank of the output signal from the threshold stage formed by NOR-gate 53.

Operation, with reference to FIG. 4: The positive flank $F_1$ of the trigger signal, graph $a$, causes the voltage at the output of the NOR-gate 52 to drop to approximately reference value. As seen in graph $d$, the voltage at the common junction point 43' drops to reference level so that, as seen in graph $e$, the output of NOR-gate 53 will have a positive voltage thereat. This positive voltage is fed back or transferred through line 60 also to the input of NOR-gate 52. Due to the presence of the positive voltage at the input of NOR-gate 52, the output of NOR-gate 52 will remain at approximately zero or reference level even after the trigger signal has disappeared. This circuit, therefore, functions similarly to a self-holding circuit.

Capacitor 31' will start to charge until it exceeds the threshold level S of NOR-gate 53. This terminates the signal from the NOR-gate 53 and also interrupts the self-holding circuit. The output of NOR-gate 52 will jump to approximately reference voltage and will remain there until the next trigger pulse occurs.

The trailing flank $F_2$ of the threshold stage formed by NOR-gate 53 is used to set the other trigger stage 20'. As seen in graph c, the voltage at junction 24' will jump to positive level and the capacitor 21' can then start to discharge through resistor 23'. The diagrams c and d thus show that the timing circuit of one trigger stage responds to a voltage below the threshold level, whereas the timing circuit of the other trigger stage responds to the voltage above the threshold level of the associated threshold switch. Thus, compensation is again provided.

The signal seen in graph f of FIG. 4 shows the combination of the signals seen in graphs e and c. The output of NOR-gate 54 will not have a signal when one of the two input signals is present. The diagrams of FIG. 4 show that the output signal of the NOR-gate 54 will disappear for the duration of the unstable phase of one trigger stage plus the duration of the unstable phase of the other trigger stage. The pulses thus are immediately adjacent each other and are not shifted with respect to time.

The chain-dotted lines again show what happens if there is a change in threshold response level. The duration $T_1$ of the unstable phase of one threshold stage is increased to the value $T_1'$; the duration $T_2$ of the unstable phase of the other trigger stage is decreased, however, to the value $T_2'$. The overall, combined time $T_1$ and $T_2$ is about the same as the time $T_1' + T_2'$ even under conditions of temperature changes.

The circuit of FIG. 3 has the advantage that signals with different ON/OFF ratios, or duty cycles, can be used. Thus, such a circuit can be used with an inductive speed transducer, or to use trigger pulses derived from the ignition system of automotive-type internal combustion engines. The output voltage will be the same under same speed conditions.

Various changes and modifications may be made within the scope of the inventive concept.

I claim:

1. Temperature independent trigger signal analysis circuit in which trigger signals are converted into an output signal having a characteristic representative of the trigger signals and their respective rate or frequency comprising means (13; 50, 52) generating a train of square-wave pulse representative of said signals;

a first monostable trigger stage (20) including means (13) connected to have said pulses applied thereto and sensing a dropping flank ($F_1$) of the pulse to set the trigger stage and provide a decaying pulse;

a first threshold sensing stage (25) having a predetermined threshold level, connected to have said decaying pulse applied thereto and providing a first output signal having a time duration representative of the time between occurrence of said dropping flank of the pulses and when the threshold level of the stage is passed by the decaying signal;

a second trigger stage (30) including means sensing a rising flank ($F_2$) of the pulse representative of said signal to set the second trigger stage, said second trigger stage being connected in parallel to the first trigger stage (20) and providing an increasing pulse;

a second threshold stage (36, 53) having a second predetermined threshold level connected to have said increasing pulse applied thereto and providing a second output signal having a time duration representative of the time of occurrence of said rising flank of the pulses and when the threshold level of the second stage is passed by the increasing signal;

and logic circuit means (36, 40, 41, 42; 54, 55) combining said first output signal and said second output signal from the first and second threshold stages to provide a composite combined output signal in which changes of temperature due to changes in response of the respective threshold circuits are compensated.

2. Circuit according to claim 1, wherein one trigger stage (20) of the monostable first and second trigger stages (20, 30) senses the leading flank ($F_1$) of the pulses and the other monostable trigger stage (30) senses the trailing flank ($F_2$) of the pulses.

3. Circuit according to claim 1, wherein one trigger stage (20) of the monostable first and second trigger stages (20, 30) senses one of the flanks of the pulses and the other monostable trigger stage (30) is responsive to a flank of the output signal of the threshold stage (25) associated with the monostable trigger stage (20) whose flanks has been sensed.

4. Circuit according to claim 1, wherein the threshold stages (25, 36; 53, 54) comprise gate circuits having threshold level responsive inputs.

5. Circuit according to claim 4, wherein said threshold level responsive gate circuits are metal-oxide-silicon (MOS)-type circuit structures in a common housing.

6. Circuit according to claim 5, wherein the logic circuit means (36, 40, 41, 42; 54, 55) comprise logic gate circuits which have threshold level responsive inputs to, simultaneously, form a threshold stage (36, 54) for one of the monostable trigger stages (30, 20') and to provide a combined logic gate — threshold gate unit.

7. Circuit according to claim 6, wherein the threshold stage (25, 53) connected to the other one of said monostable trigger stages comprises an inverter circuit structure (25, 53).

8. Circuit according to claim 7, wherein the monostable trigger circuits comprise a resistor/capacitor (R/C) (23, 21; 33, 31) network, having a common junction (24, 34) between the respective resistor and capacitor;

the capacitors (21, 31) having one electrode, each, connected together and having the flanks ($F_1$, $F_2$) derived from the trigger signal applied thereto, the resistor (23) of one monostable trigger stage (30) being connected to a source of positive supply and the other resistor (23) of the other trigger stage being connected to the source of supply at a reference level, the threshold stages being connected to the common junctions (24, 34) of the R/C circuits.

9. Circuit according to claim 1, further comprising a feedback connection (60) from the output of one of the threshold stages (53) to the input thereof to provide a self-holding circuit for the unstable duration of the monostable trigger stage (35) connected to said one threshold stage (53).

10. Temperature independent trigger signal analysis circuit in which trigger signals are converted into output signals of predetermined characteristic and representative of said trigger signals and their respective frequency or rate comprising a first timing circuit including a first resistor/capacitor timing network (21, 23);

means responsive to a flank going in a first direction of said trigger signal and initiating a first timing interval by dynamically changing the charge state of the capacitor (21) of the first resistor/capacitor network;

a first threshold stage (25, 54) detecting when, during change of the charge state of the capacitor of said timing network, the capacitor reaches a first predetermined charge threshold level, and providing a first timed output signal beginning at said timing interval and terminating when the first threshold level is sensed;

a second timing circuit (30) including a second resistor/capacitor timing network (31, 33);

second means responsive to a flank going in a direction opposite to first direction ($F_2$) of said signal and initiating a second timing interval by dynamically changing the state of the charge of the capacitor in the second resistor/capacitor network;

a second threshold stage (36, 53) detecting when, during change of the charge state of the capacitor of the second timing network, the capacitor thereof reaches a second predetermined charge threshold level and providing a second timed output signal beginning at said timing interval and terminating when the second threshold level is sensed;

and logic means (36, 40; 54) combining said output signals to provide an overall combined signal which, upon temperature change, will have an increased component derived from one threshold stage and a decreased component from the other threshold stage, or vice versa, to provide said combined output signal in a form essentially independent of change of temperature.

11. Circuit according to claim 10, wherein said trigger signal is a train of essentially square-wave pulses, said first and second means being responsive to the leading and trailing flanks, respectively, of said essentially square-wave pulses.

12. Circuit according to claim 10, including a pulse source providing a pulse train;

and wherein said trigger signals are essentially square-wave pulses derived from and representative of said trigger signals, said first and second means being responsive to the leading and trailing flanks of said essentially square-wave pulses.

13. Circuit according to claim 10, wherein said trigger signals are, respectively, a flank of a trigger signal and a flank of one of the output signals derived from one of the threshold stages connected to the respective timing network, the timing function of which was initiated by said trigger signal.

* * * * *